United States Patent [19]

Choate et al.

[11] 4,047,163
[45] Sept. 6, 1977

[54] FAULT-TOLERANT CELL ADDRESSABLE ARRAY

[75] Inventors: William Clay Choate, Dallas; Dileep P. Bhandarkar, Richardson, both of Tex.

[73] Assignee: Texas Instruments Incorporated, Dallas, Tex.

[21] Appl. No.: 592,979

[22] Filed: July 3, 1975

[51] Int. Cl.² .................. G11C 11/40; G11C 13/00
[52] U.S. Cl. .................. 340/173 R; 340/173 BB; 364/900
[58] Field of Search .......... 340/173 R, 173 BB, 172.5

[56] References Cited

U.S. PATENT DOCUMENTS

| | | | |
|---|---|---|---|
| 3,436,734 | 4/1969 | Pomerewe | 340/173 BB |
| 3,659,275 | 4/1972 | Marshall | 340/173 BB |
| 3,748,653 | 7/1973 | Debruyne | 340/173 BB |
| 3,781,826 | 12/1973 | Beausoleil | 340/173 BB |
| 3,800,294 | 3/1974 | Lawlor | 340/173 BB |
| 3,813,650 | 5/1974 | Hunter | 340/173 BB |
| 3,845,476 | 10/1974 | Boehm | 340/173 BB |
| 3,882,470 | 5/1975 | Hunter | 340/173 BB |
| 3,897,626 | 8/1975 | Beausoleil | 340/173 BB |

*Primary Examiner*—Terrell W. Fears
*Attorney, Agent, or Firm*—Harold Levine; James T. Comfort; William E. Hiller

[57] ABSTRACT

A small programmable memory means such as an electrically programmable logic array is incorporated on the chip of a conventional bit addressable random access memory or other cell addressable array circuit. The array has one or more superfluous rows and/or columns of cells held in reserve. Processing and testing of the chip is conducted in a conventional manner. Chips with faulty cells are corrected by programming the memory means with the cell addresses of the faulty cell locations. Subsequently, the memory means will respond to any of these addresses and, through interaction with input/output logic, cause the data input and/or output to be steered to or from a reserve cell instead of the addressed faulty cell.

53 Claims, 12 Drawing Figures

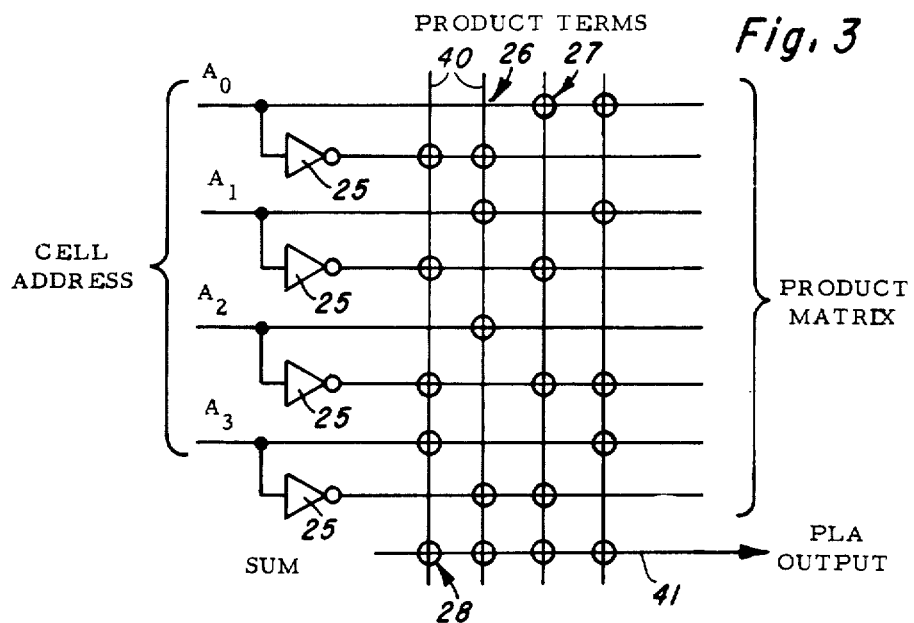
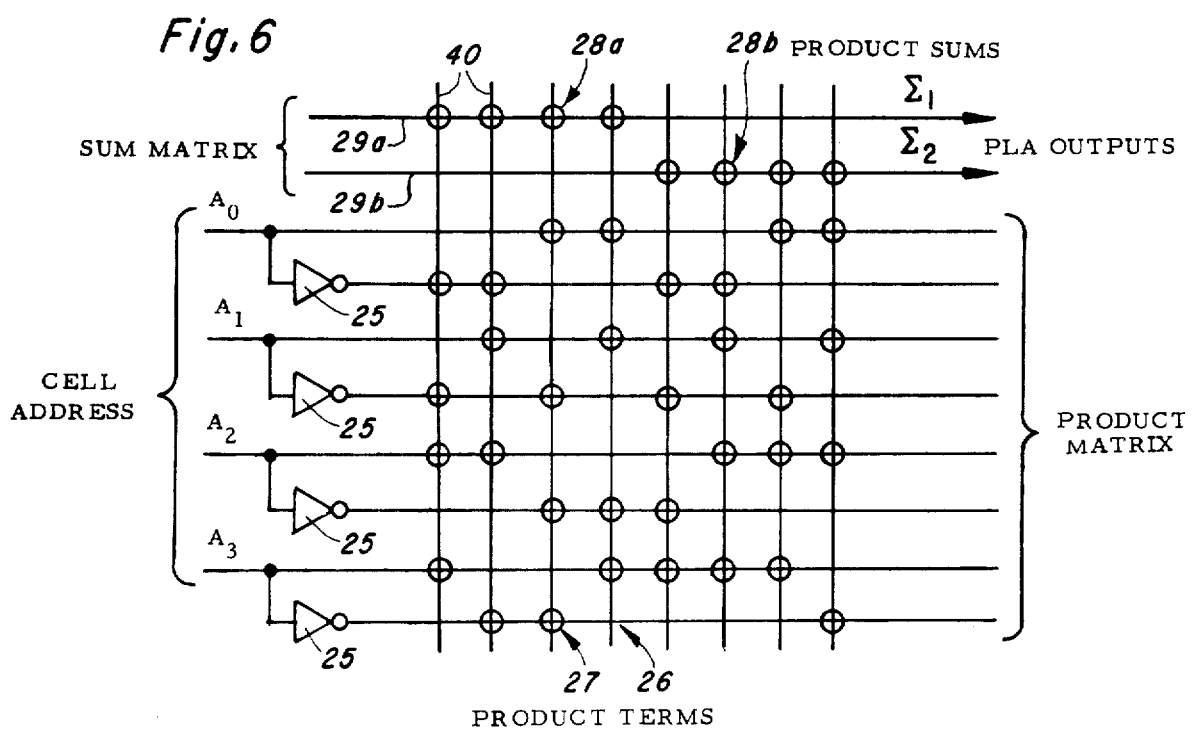

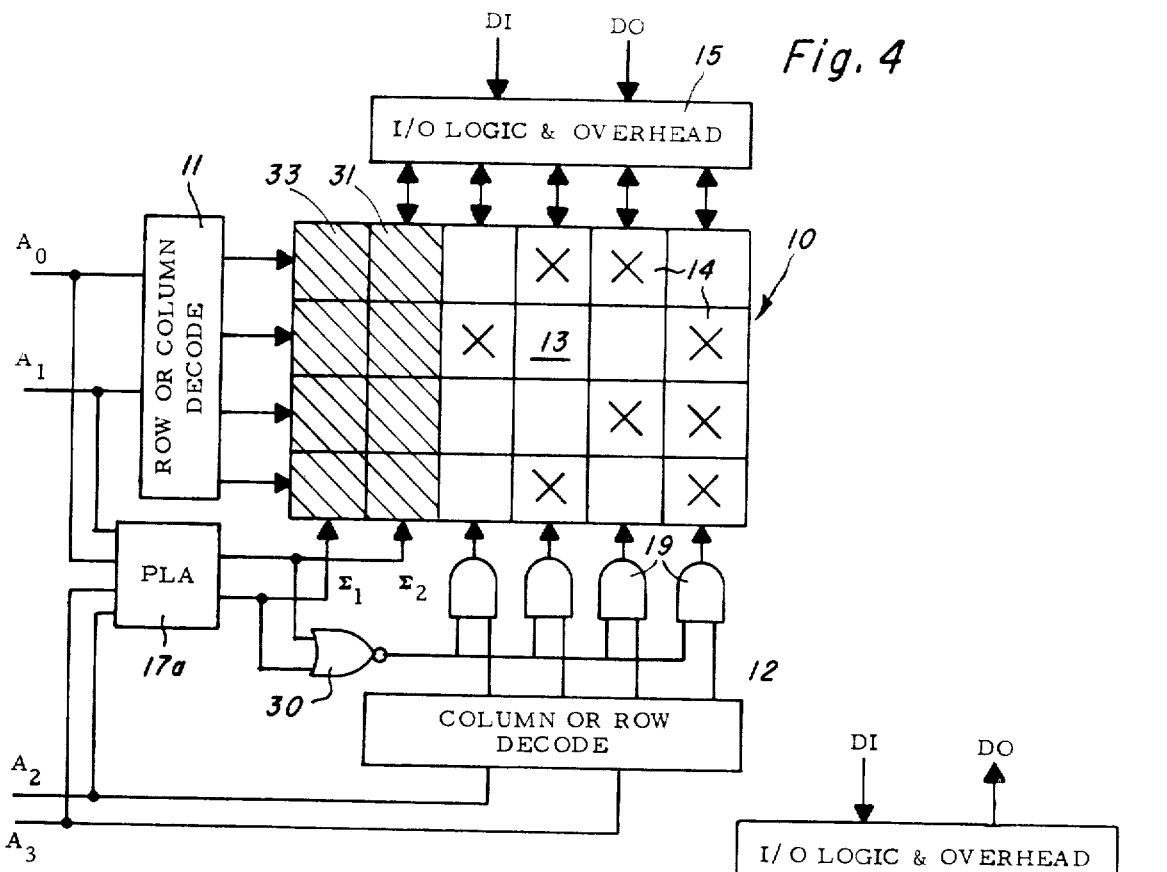

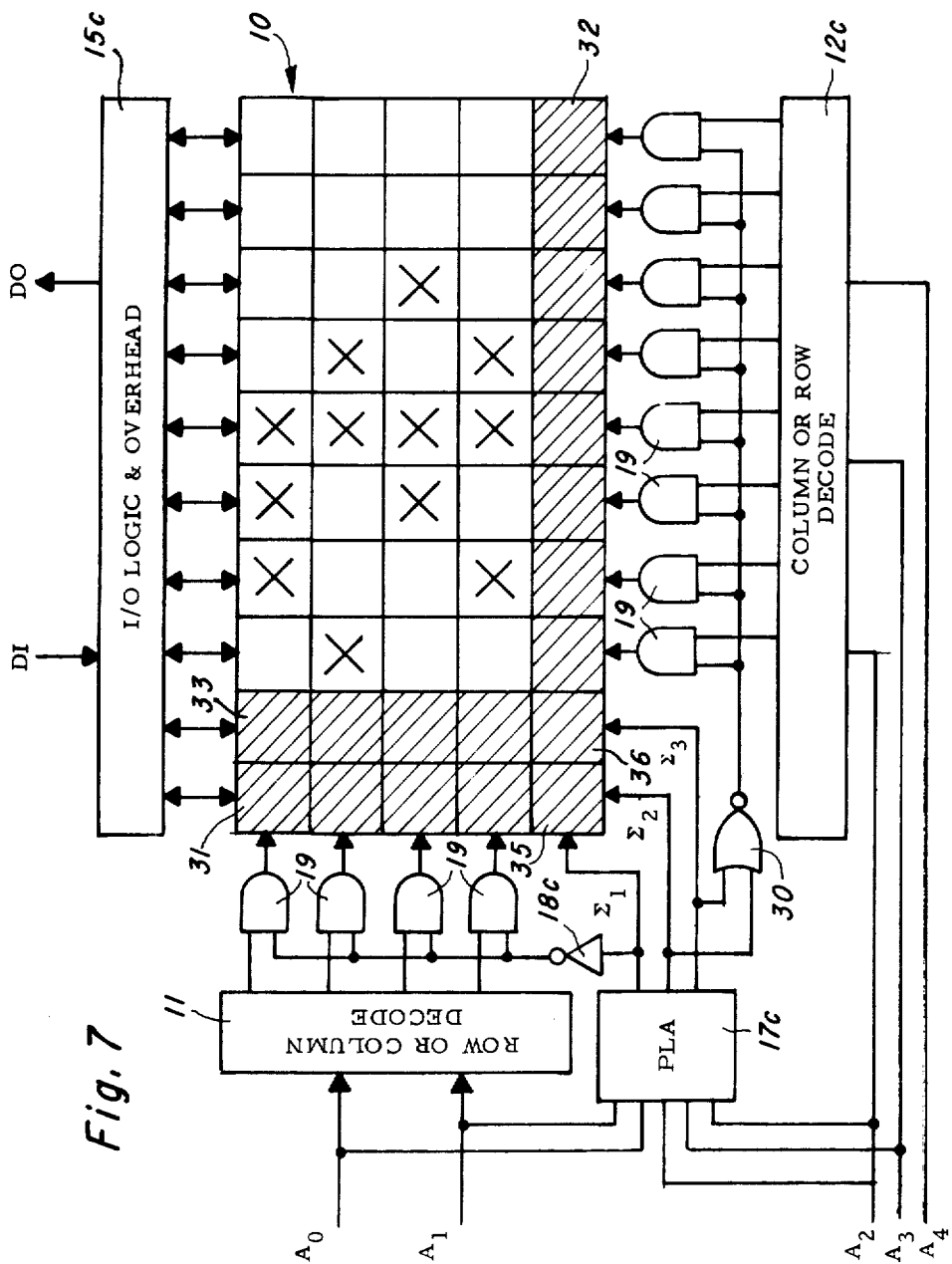

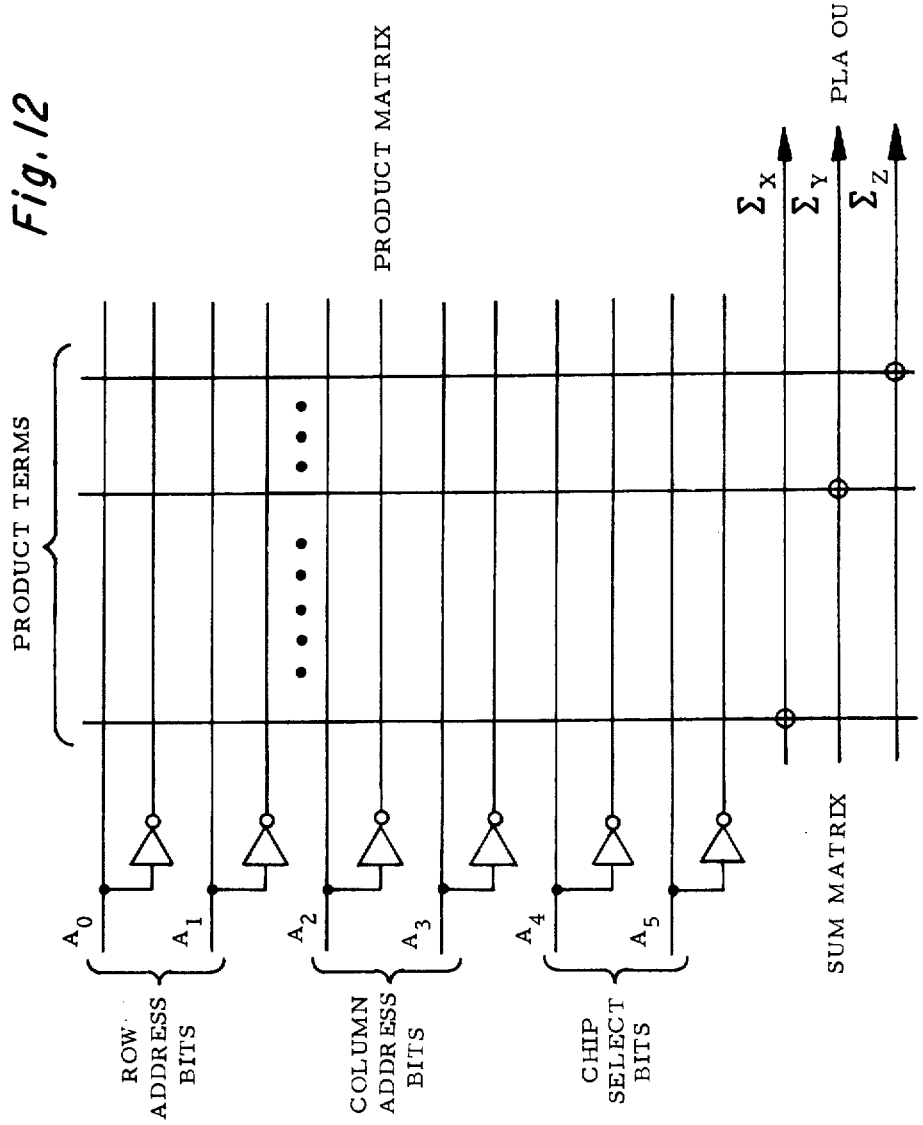

FAULT-TOLERANT CELL ADDRESSABLE ARRAY

BACKGROUND OF THE INVENTION

1. Field of the Invention

This invention relates to cell addressable arrays such as memory arrays and, more particularly, to such arrays which are capable of substituting good cells for defective cells without affecting the normal external addressing of the array.

2. Description of the Prior Art

Cell addressable arrays are well known in the art. For example, bit addressable random access memory arrays implemented in both bipolar and metal-insulator-semiconductor devices have been functionally organized on, for example, a single semiconductor chip with its own decoders and input/output logic and overhead circuitry. See U.S. Pat. No. 3,436,738 for an example of a bit addressable bipolar memory array and U.S. Pat. No. 3,740,731 for an example of a bit addressable MOS memory array, each assigned to the assignee of the present invention. See also U.S. Pat. No. 3,765,003 for another example of an MOS bit addressable random access memory. Array processors are described in U.S. Pat. No. 3,757,308.

Defect-tolerant memory systems have been suggested in the prior art in which a whole redundant row or column of cells is substituted for a selected row or column containing one or more defective cells. Consider, for example, U.S. Pat. No. 3,633,175 which describes a word addressable memory array incorporating a plurality of redundant rows which may be substituted for defective rows of cells by storing the word address of each defective row in a content addressable memory along with the address of a respective one of the redundant rows. Other examples of word addressable memories utilizing redundant word locations which may be substituted for defective word locations in the primary memory include U.S. Pat. Nos. 3,311,887; 3,331,058; and 3,422,402.

The defect-tolerant memory system of U.S. Pat. Nos. 3,753,244 and 3,753,235 include a cell addressable array with an extra line of cells on the chip together with a defective word address store and a comparator circuit for disabling a defective line of cells and replacing it with the extra lines of cells. In U.S. Pat. No. 3,753,244, the address is stored by selectively open-circuiting wire links of a read-only memory while in U.S. Pat. No. 3,753,235, wires are bonded to selectively ground bits of the read-only memory to store the defective addresses.

A similar defect-tolerant memory system is described in U.S. Pat. No. 3,755,791 in which the defective address store is electrically programmable and utilizes nonvolatile MNOS semiconductor devices arranged in a cross-coupled configuration. Again, in each of these examples, a single superfluous row or column is provided and only the row or column address is applied to the defective address store to switch the input address from the defective row or column to the redundant row or column. See also U.S. Pat. Nos. 3,714,637; 3,644,899; 3,738,761; 3,781,826; 3,772,652; 3,765,001; and 3,735,368 for other examples of address translation logic which permits a monolithic memory to utilize defective storage cells.

A still further example of a prior art defect-tolerant memory system is described in U.S. Pat. No. 3,659,275 in which a word addressable read-only memory having permanently stored words of data therein is accessed in parallel with a word location in a redundant memory. The words of data from the redundant memory contain at least one tag bit which determines whether the data from the read-only memory or from the redundant memory element is to be provided at the output terminals of the memory system.

As can be seen from the above discussion of the prior art, in each example, whether the memory be of the word addressable or cell addressable type, a requirement thereof is that at least one redundant line of cells be provided for each row or column in which one or more bad cells exist and that faulty bit locations of a memory array can only be tolerated to the extent that rows or columns in which such faulty locations exist do not exceed the total number of superfluous lines provided.

SUMMARY OF THE INVENTION

In accordance with the present invention, an improved cell addressable array of cells such as a bit addressable memory array is provided with superfluous cells, for example, by providing an additional row and/or column of cells. An advantage of the present invention is that systems embodied therein are capable of substituting individual cells of the superfluous line or column for defective cells of the array even if the defective cells are not in a single line of the array. For example, a memory embodying the present invention is capable of correction where the distribution of defective bits is as illustrated in FIG. 1 of U.S. Pat. No. 3,753,235 referenced above which, as stated in said patent, the system of said patent is ineffective to correct since only one of two defective cells in two different lines is capable of being substituted for with only a single redundant line. Systems embodied in the present invention are also capable of correcting the defective bit arrangement illustrated in FIG. 1 of U.S. Pat. No. 3,633,175, referenced above, with only a single superfluous line of cells while the system of said patent requires at least two redundant lines of cells to correct the illustrated defects.

Accordingly, an object of the present invention is to provide an improved fault-tolerant cell addressable array.

Another object of the invention is to provide an addressable array of cells in which a plurality of cells located on different rows and columns of the array may be individually substituted for by the cells in a redundant row or column of cells.

A further object of the invention is to provide a means whereby a defective cell in a cell addressable array can be replaced by a superfluous cell on an individual basis.

Still another object of the invention is to provide fully operable monolithic semiconductor arrays containing bad cell locations.

It is yet another object of the invention to facilitate the use of arrays having defective cells without the necessity of generating special metallization or wiring patterns.

Still a further object of the present invention to increase the yield of the production process for semiconductor arrays such as memory arrays by using arrays containing defective cells therein.

Still a further object of the invention is to provide an improved system in which defective cell locations can be substituted for electrically and/or mechanically and the substitution retained even when all power to the system is shut off.

Another object of the invention is to provide an array such as a memory array in which bad cell locations can be substituted for either temporarily or semi-permanently, either at the time of testing or subsequently.

A further object of the invention is to provide improved memory systems capable of automatically accommodating for defective memory bit locations.

Another object of the invention is to provide improved monolithic semiconductor memory arrays.

Still another object of the invention is to provide an improved memory system which is capable of reliable operation even though defective locations are contained in the semiconductor arrays used to comprise the memory.

It is still another object of the invention to provide a memory system that uses memory modules containing semiconductor storage arrays having defective cells therein.

It is a further object of the invention to provide modules for use in memory systems in which semiconductor arrays containing defective bits can be utilized without changing the external configuration of the module.

Yet another object of the invention is to provide defect-tolerant semiconductor memory equipment that is economically more favorable than present semiconductor memories.

Still another object of the invention is to provide defect-tolerant memory equipment capable of remote electrical substitution of spare memory locations for memory locations that are or become defective.

A further object of the invention is to provide memory equipment that can operate with undiminished capacity even when memory defects occur during use.

These and other objects and advantages are accomplished in accordance with embodiments of the present invention in which a cell addressable array of cells including superfluous cells is provided in combination with a faulty cell address storage means and means responsive to such storage means for causing one of the superfluous cells or the contents thereof to be selected instead of the faulty cell. In one embodiment of the invention, a cell addressable array arranged in rows and columns, such as a memory array, includes a superfluous row or column of cells in combination with a faulty cell address storage means which includes means for storing both the row and column address of each defective cell. Whenever one of the defective cells is addressed, the storage means generates a signal which causes a corresponding cell or the contents thereof in the superfluous row or column to be selected instead of the faulty cell. With the provision of a single superfluous row, for example, a defective cell may be replaced in each column of the array, with any number of these defective cells being in any number of different rows. In another embodiment of the invention, a cell addressable array arranged in rows and columns includes a plurality of superfluous rows or columns of cells in combination with a faulty cell address storage means which includes means for storing both the row and column address of each defective cell. Whenever one of the defective cells is addressed, the storage means generates signals which cause a corresponding cell or the contents thereof in a selected one of the superfluous rows or columns to be selected instead of the faulty cell. With the provision of $n$ superfluous rows, for example, as many as $n$ defective cells may be replaced in each column of the array, with any number of these defective cells being in any number of different rows. In still another embodiment of the invention, a cell addressable array in rows and columns includes a superfluous row and column of cells in combination with a faulty cell address storage means which includes means for storing both the row and column address of each defective cell. Whenever one of the defective cells is addressed, the storage means generates signals which cause a corresponding cell or the contents thereof, in the superfluous row or column, to be selected instead of the faulty cell. With the provision of the single superfluous row and column, for example, a defective cell may be replaced in each column of the array with any number of the defective cells being in any number of different rows and an additional defective cell may be replaced in each row of the array with any number of the additional defective cells being in any number of different columns. In a further embodiment of the invention, a cell addressable array arranged in rows and columns includes a superfluous row and plurality of columns, a superfluous column and plurality of rows or a plurality of rows and a plurality of columns of cells in combination with a faulty cell address storage means which includes means for storing both the row and column address of each defective cell. Whenever one of the defective cells is addressed, the storage means generates a signal which causes a corresponding cell or the contents thereof in a selected of the superfluous rows or columns to be selected instead of the faulty cell. With the provision of $n$ superfluous rows and $\eta$ superfluous columns, for example, $n$ defective cells may be replaced in each column of the array with any number of these defective cells being in any number of different rows and an additional $\eta$ defective cells may be replaced in each row of the array with any number of the additional defective cells being in any number of different columns. In yet another embodiment of the invention, a cell addressable array of cells including superfluous cells as described in any of the above embodiments provided in combination with a faulty cell address storage means and means responsive to said storage means for causing one of the superfluous cells or the contents thereof to be selected instead of the faulty cell. In the further embodiments, the address storage means stores an array or chip address as well as the row and column address of each defective cell. Whenever one of the defective cells is addressed, the storage means generates a signal which causes a corresponding superfluous cell within the same or in a superfluous array of cells to be selected instead of the addressed faulty cell thereby providing a three dimensional cell substitution arrangement.

The array may comprise a random access or read-only memory implemented, for example, as a bipolar or MOS monolithic semiconductor structure or the array may be of higher complexity with the cells providing complex functions such as the functional cells of a pipelined or other arithmetic logic/unit utilized in a central processor of a computer or may comprise an entire bit processor such as an array processor. Embodiments of the invention may be implemented as monolithic structures or may comprise a plurality of modules with each module, for example, comprising a semiconductor integrated circuit.

The address storage means is preferably of the content addressable type although decode addressable storage means such as a ROM or nonvolatile RAM may be utilized. Content addressable storage means such as programmable logic arrays or ROMs may be of the electrically programmable type such as those incorporating fusible links, floating gate MOS or MNOS techniques or may be mechanically programmable incorporating wires which may be selectively cut or terminal pads to which wires may be selectively bonded in order to store the addresses of the faulty cells after the device has been manufactured, in test or subsequently in the field.

In one aspect of the invention, the faulty cell address storage means includes means coupled at the row or column input select of the array for selecting a spare row or column and inhibiting normal selection while in another aspect of the invention, the faulty cell address storage means includes means coupled at the output of the array for selecting data output from either the array or the spare row or column. In most instances, the input is provided to both a faulty cell in the array and the substitute cell in the spare row or column with no unfavorable effect, as any bad data generated by the faulty cell will be ignored in favor of the data generated by the substitute cell at the time the generated data is required to be output.

Still further advantages and the fulfillment of further objectives will become apparent from the detailed description and claims and from the accompanying drawings wherein:

BRIEF DESCRIPTION OF THE DRAWINGS

FIG. 3 is a logic diagram of an exemplary address storage means operable in conjunction with the embodiments of FIGS. 1 and 2.

FIG. 4 is a logic diagram of still another embodiment of the invention incorporating a plurality of superfluous rows or columns of cells;

FIG. 5 is a logic diagram of yet another embodiment of the invention incorporating a redundant row and a redundant column;

FIG. 6 is a logic diagram of an exemplary address storage means operable in conjunction with the embodiments of FIGS. 4 and 5;

FIG. 7 is a logic diagram of an embodiment of the invention which incorporates one or more redundant rows and one or more redundant columns;

FIG. 12 is a logic diagram of an exemplary address storage means operable in conjunction with the embodiment of FIG. 10.

DETAILED DESCRIPTION OF EMBODIMENTS OF THE INVENTION

In accordance with embodiments of the present invention, a cell addressable array of cells such as a bit addressable memory array includes a superfluous group of cells in combination with a faulty cell address storage means and means responsive to said storage means for causing one of the superfluous cells or the contents thereof to be selected instead of the faulty cell.

Figure 1:
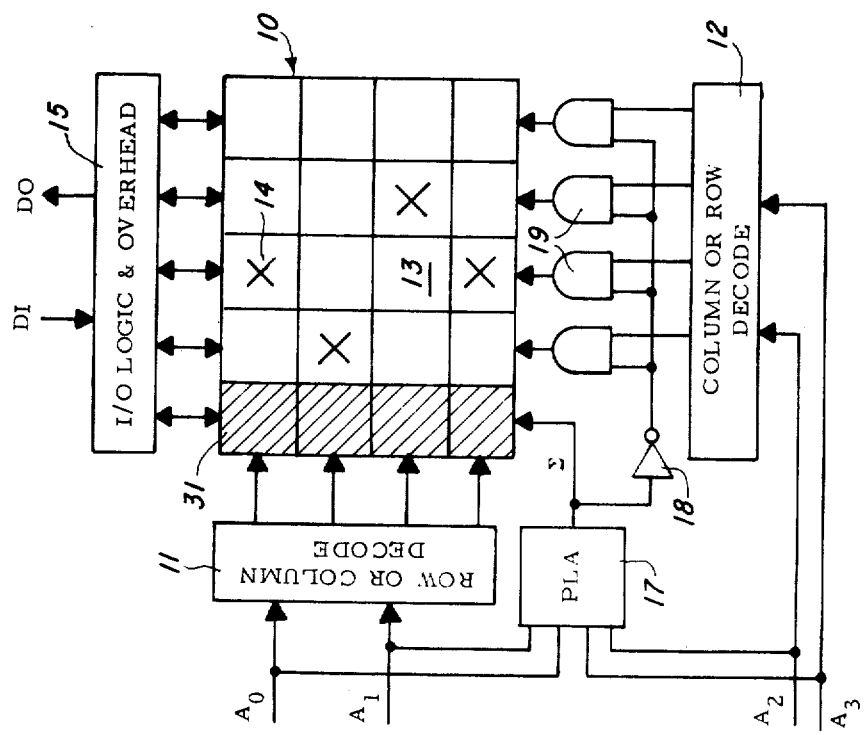
FIG. 1 is a logic diagram of an embodiment of the invention incorporating a single redundant row or column.

As illustrated in FIG. 1, in one embodiment of the invention a cell addressable array 10 is arranged in rows and columns of cells 13 and includes a superfluous row or column of cells 31 in combination with a faulty cell address storage means 17 such as a programmed logic array (PLA) which includes means for storing both the row and column address $(A_0,A_1)$, $(A_2,A_3)$ of each defective (marked X in the examples) cell 14 to be replaced. The system as illustrated in FIG. 1 includes a row decoder and a column decoder 11 and 12 which in combination receive the address and select an individual cell for input, output or other cell manipulation. For example, the row decoder may be of the type which decodes an $n$ bit binary input signal to generate a one of $2^n$ signal to select one of $2^n$ rows and the column decoder may be of the type which decodes an N bit binary input signal to generate a one of $2^N$ signal to select one of $2^N$ columns. Although the array of FIG. 1 is exemplified as a $4 \times 4$ array, it it intended that this be for purposes of illustration only and it is obvious that an $n \times N$ array of any desired magnitude may be provided in accordance with this or other illustrated embodiments of the present invention.

Input/output logic and other conventional overhead circuitry 15 is also provided for the operation of the array. The input/output logic and circuitry may include, for example, sense amplifiers, output bus steering gates, input bus steering gates and drivers. Other overhead circuitry may include, for example, the refresh logic ordinarily provided for an MOS memory array.

Whenever one of the defective cells 14 is addressed, the storage means 17 recognizes such address and generates an output signal $\Sigma = 1$ which causes a corresponding cell in the superfluous column or row 31 to be selected instead of the defective cell. With $\Sigma = 1$, the output of NOT gate 18 $\overline{\Sigma} = 0$ so that the normal selection of decoder 12 is inhibited by means of AND gates 19. In the addressing of normal cells, the output of storage means 17 $\Sigma = 0$ the output of NOT gate 18 $\overline{\Sigma} = 1$ inhibiting selection of the superfluous column or row 31 and allowing normal cell selection by decoder 12 through AND gates 19.

Figure 2:
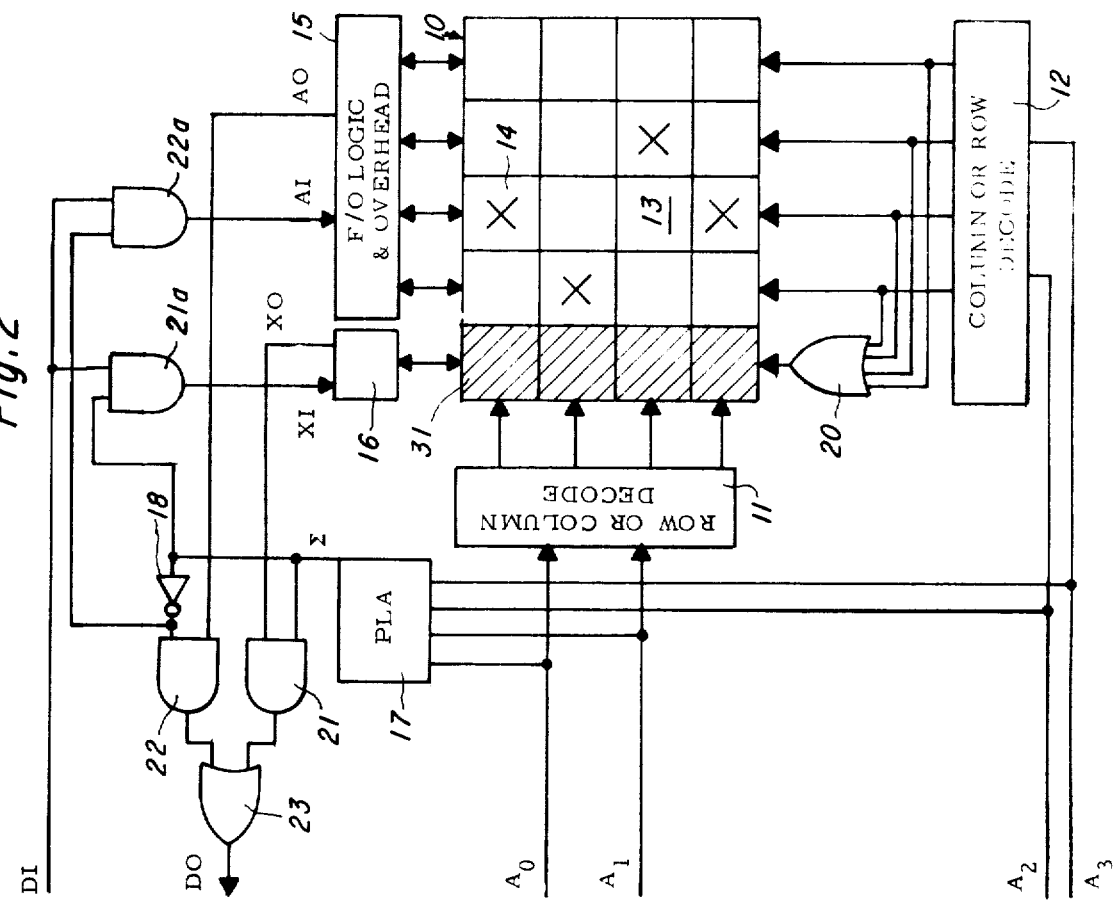
FIG. 2 is a logic diagram of another embodiment of the invention incorporating a single spare row or column.

Another embodiment of the invention, illustrated in FIG. 2, also includes a cell addressable array 10 arranged in rows and columns of cells 13 and a superfluous row or column of cells 31 in combination with a faulty cell address storage means 17 such as a programmed logic array (PLA) which stores both the row and column address $(A_0,A_1)$, $(A_2,A_3)$ of each defective cell 14 to be replaced. In this embodiment the replacement cell is not addressed instead of the defective cell but instead both the defective cell and the replacement cell are simultaneously addressed and whenever a defective cell is detected, the faulty cell address storage means 17 generates a signal to direct the data into or out of the reserve cell rather than the faulty cell.

Thus, whenever any one of the column or row of array 10 is selected by means of decoder 12, the reserve column or row 31 is simultaneously addressed by means of OR gate 20. Separate input/output logic and overhead circuitry 16 is provided for the reserve column or row 31 so that the output XO and input XI of column 31 may be separately selected from the array output AO and array output AI depending upon the output signal $\Sigma$ generated by faulty cell storage means 17. Thus, whenever one of the defective cells 14 is addressed in an output storage means 17 recognizes such address and generates an output signal $\Sigma = 1$ which allows AND gate 21 to transmit the redundant column or row output data XO to the data output line DO by means of OR gate 23. With $\Sigma = 1$ the output of NOT gate 18 $\overline{\Sigma} = 0$ so that the normal data output selection from the array output line AO is inhibited by means of AND gate 22. In the addressing of normal cells for an output operation, the output of storage means 17 $\Sigma = 0$ and the output of NOT gate 18 $\overline{\Sigma} = 1$ which inhibits selection of the data output XO from the superfluous column or row 31 by AND gate 21 and allows normal data output transfer from output AO of the array by AND gate 22 through OR gate 23. Data is input to array 10 on the data input line DI and is directed to the array input AI by AND gate 22a in the addressing of normal cells with $\Sigma = 0$ or to the input XI of the redundant column 31 by means of AND gate 21a whenever a faulty address is recognized by the storage means 17 which generates an output signal $\Sigma = 1$. In the case where the array 10 is comprised of ROM cells, the gates 21a and 22a would of course be unnecessary.

The faulty cell address storage means is preferably of the content addressable type although decode addressable storage means such as a ROM or RAM with non-volatile RAM cells may be utilized. A logic diagram of a content addressable storage means commonly referred to as a programmable logic array or sometimes as a programmable ROM is illustrated in FIG. 3. The addresses indicated as being stored in the diagram of FIG. 3 and Table I below are representative of the defective cell pattern shown in FIGS. 1 and 2 and are given by way of example only.

The programmable logic array is preferably "field programmable" so that the addresses of the faulty cells may be stored after the array and its associated circuitry have been manufactured either during test when one or more faulty cells are discovered or subsequently in the field when one or more cells become defective during use. Such field programmable logic arrays, both the mechanically programmable and the electrically programmable types are well known in the art. Consider, for example, the programmable logic array of FIG. 3. In accordance with the invention, both the row and column address $(A_0, A_1)$, $(A_2 A_3)$ is input to the logic array and the complement of each address bit generated by means of a NOT gate 25. The product terms 40 are representative of AND gates with the circled crossings 27 representative of connections to the AND gate and the uncircled crossings 26 representative of open or nonconnections to the AND gate. Each address is thus stored by selectively effecting connections or nonconnections to a respective product term line 40 of the logic array representing an AND function. See, for example, U.S. Pat. No. 3,245,051 which discusses programmable information storage matrices. The product term lines are selectively connected to one or more output lines 41 in a sum matrix representative of an OR function of all of the term lines connected thereto. Connection to the output line is effected by providing a connection 28 thereto.

TABLE I

| ADDRESS | | | | |
|---|---|---|---|---|
| $A_0$ | $A_1$ | $A_2$ | $A_3$ | OUTPUT |
| 0 | 0 | 0 | 1 | 1 |
| 0 | 1 | 1 | 0 | 1 |
| 1 | 0 | 0 | 0 | 1 |
| 1 | 1 | 0 | 1 | 1 |

TABLE I-continued

| ADDRESS | | | | |
|---|---|---|---|---|
| $A_0$ | $A_1$ | $A_2$ | $A_3$ | OUTPUT |
| E | L | S | E | 0 |

The connections of the cell addresses to the product term lines (and the connections of the product term lines to the sum lines where desired) may be mechanically effected by the selective bonding of wires or, with the logic array fabricated to include wires at each crossing, selectively removing some of the wires as suggested by the U.S. Pat. No. 3,245,051 referenced above. In a preferred embodiment, the product and/or sum matrices are electrically programmable. For example, the address lines may all initially be connected to the product term lines by means of fusible links which are selectively blown by applying a relatively high voltage between the product term line and the address or address complement line. This technique is well known in the art and is utilized, for example, in the 825100 and 825101 bipolar programmable logic arrays sold as standard parts by Signetics and described in detail in the data sheets and applications bulletins provided by Signetics describing the product. Other state-of-the-art field programmable logic arrays particularly suitable for use in conjunction with a monolithic integrated bipolar embodiment of the invention employs avalanche induced migration transistor techniques. The avalanche induced migration transistors are of the NPN type, the emitter of each being contacted by an aluminum column line and the collector of each being in common with the collectors of others of the transistors and the row driver collector. Programming of the array is accomplished by forcing a high current through selected elements from emitter to collector which forces the emitter-base junction beyond normal avalanche and into a second breakdown mode. In the second breakdown mode, the current constricts to a high temperature filament and aluminum from the column line then migrates down the filament to the emitter-base junction and causes a short of that junction. The drop in power dissipation, as soon as the emitter-base short is achieved, causes a decrease in temperature preventing further advance of migrating aluminum. An example of such a field programmable logic array which may be employed in conjunction with the present invention is the IM5200 manufactured and sold as a standard product in Intersil and described in the data sheets and application notes provided by Intersil.

Where the array is a monolithic integrated MOS structure, a content addressable storage means employing MNOS transistors such as that described in U.S. Pat. No. 3,755,791 referenced above may be employed with the number of bits stored by said storage means being modified to include both the row and column address in accordance with the teachings of the present invention.

A common type of MOS programmable logic or memory array incorporates gate programmable MOS transistors. Instead of utilizing thick and thin oxide to permanently program an MOS PLA as described in U.S. Pat. No. 3,541,543, floating gate MOS transistors, commonly referred to as FAMOS, are substituted which are electrically programmable after the chip processing has been complete in test or subsequently in the field. The gates are programmed by applying a relatively high voltage between the product term lines and the address or address complement lines, in a similar manner to that employed with fusible links until avalanche breakdown has occurred and the transistor thereby programmed. See, for example, Dov Frohman-Bentchkowsky, "A Fully Decoded 2048-Bit Electrically Programmable FAMOS Read-Only Memory," *IEEE Jour. of Solid-State Circuits*, Vol. SC-6, No. 5, October 1971. See also R. C. Dockerty, "Degradation Mechanisms in Rewritable N-Channel FAMOS Devices," *Proceedings of the International Reliability Physics Symposium*, Apr., 1-3, 1975, Las Vegas.

The programmed logic array illustrated in FIG. 3 includes four product term lines 40 for the storage of the addresses of up to four defective cells which can be substituted for by the four cells in the redundant column or row 31 of the embodiments of FIGS. 1 or 2. This is given by way of example only. For some purposes it is desirable to provide less term lines or storage locations for the storage of faulty cell addresses than the number of substitute cells available. For example, it has been found that greatly increased yields may be achieved in the production of monolithic integrated circuit memories such as a monolithic integrated 4096-bit random access memory circuits with 64 × 64 bit storage arrays by providing a single redundant row or column (of 64 bits) and a programmable logic array with, for example, four term lines for the storage of up to four defective cell locations. This is because most (about 80–90%) of the monolithic 4K memories which it is possible to save by employing the techniques embodied in the present invention have fewer than four bad bit locations. Any increase in the chip size to incorporate the PLA or other storage means to detect the four bad bit locations is significant. In this case, increasing the capacity of the storage means beyond a certain point will have a decreasingly positive effect and eventually a negative effect as the size of the faulty cell address storage means significantly increases the total chip size and itself contributes to reducing yields.

In another embodiment of the invention, as illustrated in FIG. 4, a cell addressable array 10 arranged in rows and columns includes a plurality of superfluous columns or rows of cells 31 and 33 in combination with a faulty cell address storage means such as PLA 17a which includes means for storing both the row and column addresses of each defective cell.

Whenever one of the defective cells 14 is addressed, storage means 17a recognizes such address and generates either an output signal $\Sigma_1 = 1$ which causes a corresponding cell in the superfluous column or row 33 or an output signal $\Sigma_2 = 1$ which causes a corresponding cell in the superfluous column or row 31 to be selected instead of the defective cell. With $\Sigma_1 = 1$ or $\Sigma_2 = 1$ the output of NOR gate 30 $\overline{\Sigma_1 + \Sigma_2} = 0$ so that the normal selection of decoder 12 is inhibited by means of AND gates 19. In the addressing of normal cells, the outputs of storage means 17a $\Sigma_1 = 0$, $\Sigma_2 = 0$ and the output of NOR gate 18 $\overline{\Sigma_1 + \Sigma_2} = 1$ thereby inhibiting selection of either of the superfluous columns or rows 31 and 33 and allowing normal cell selection by decoder 12 through AND gates 19.

Although only two redundant columns or rows have been illustrated in FIG. 4, it can be seen that any number of superfluous rows or columns may be provided. With the provision of $\eta$ redundant columns, for example, $\eta$ defective cells may be replaced in each row of an $n \times N$ array, with any number of the defective cells being in any number of different columns.

FIG. 5 illustrates still another embodiment of the invention in which both a redundant column and a redundant row are provided. Whenever one of the defective cells 14 is addressed, the storage means 17a recognizes such address and generates either output signals $\Sigma_1 = 1$, $\Sigma_2 = 0$ which cause a corresponding cell in the superfluous row or column 32 to be selected, output signals $\Sigma_1 = 0$, $\Sigma_2 = 1$ which cause a corresponding cell in the superfluous column or row 31 to be selected, or output signals $\Sigma_1 = 1$, $\Sigma_2 = 1$ which cause the cell 35 in the superfluous column and row to be selected instead of the defective cell. With $\Sigma_1 = 1$ the output of NOT gate 18b $\overline{\Sigma_1} = 0$ so that the normal selection of decoder 11 is inhibited by means of the AND gates 19 coupled thereto. With $\Sigma_2 = 1$ the output of NOT gate 18a $\overline{\Sigma_2} = 0$ so that the normal selection of decoder 12 is inhibited by means of the AND gates 19 coupled thereto. In the addressing of normal cells, the output signals from storage means 17a are $\Sigma_1 = 0$, $\Sigma_2 = 0$ and the outputs of NOT gates 18b and 18a are $\overline{\Sigma_1} = 1$ and $\overline{\Sigma_2} = 1$, respectively, thereby inhibiting selection of either the superfluous row or column of cells 31 or 32 allowing normal selection by the decoders 11 and 12 through respective AND gates 19a.

An exemplary programmed PLA or ROM suitable for use in conjunction with the above described embodiments of FIGS. 4 and 5 is illustrated in FIG. 6 and described in Table II below. In this particular embodiment, there are two sum lines 29a and b in the sum matrix. One or more of the product term lines 40 is selectively coupled to the (OR gate input) sum line 29a by means of a positive connection 28a therewith and one or more of the product term lines 40 is selectively coupled to the (OR gate input) sum line 29b by means of a positive connection 28b therewith to form the plurality of PLA outputs $\Sigma_1$ and $\Sigma_2$. As discussed with respect to the PLA of FIG. 3, any desired number of product term lines may be provided and the eight shown here are by way of example only. In some embodiments the number of product term lines will be equal to the number of available redundant cells while in other embodiments a lesser number of product term lines will be provided which is sufficient to replace some preselected expected number of defective cells.

Again, although a content addressable memory PLA or ROM is illustrated in FIG. 6, addressable storage means such as ROMs or nonvolatile RAMs may be utilized to provide the faulty cell address storage means. Where a PLA is utilized, it may be of the mechanically programmable or electrically programmable type utilizing, for example, any of the techniques described with respect to the PLA of FIG. 3.

TABLE II

| ADDRESS | | | | OUTPUTS | |
|---|---|---|---|---|---|
| $A_0$ | $A_1$ | $A_2$ | $A_3$ | $\Sigma_1$ | $\Sigma_2$ |
| 0 | 0 | 1 | 1 | 1 | 0 |
| 0 | 1 | 1 | 0 | 1 | 0 |
| 1 | 0 | 0 | 0 | 1 | 0 |
| 1 | 1 | 0 | 1 | 1 | 0 |
| 0 | 0 | 0 | 1 | 0 | 1 |
| 0 | 1 | 1 | 1 | 0 | 1 |
| 1 | 0 | 1 | 1 | 0 | 1 |
| 1 | 1 | 1 | 0 | 0 | 1 |
| E | L | S | E | 0 | 0 |

In another embodiment of the invention, illustrated in FIG. 7, a cell addressable array 10a arranged in rows and columns includes at least one superfluous row 32 and a plurality of superfluous columns 31 and 33 (or at least one superfluous column and a plurality of rows or a plurality of rows and a plurality of columns) of cells in combination with faulty cell address storage means 17c which stores both the row and column addresses of each defective cell. Whenever one of the defective cells 14 is addressed, the storage means 17c generates signals $\Sigma_1 - \Sigma_3$ which cause a corresponding cell in a selected of the superfluous rows or columns 31-33 to be selected instead of the faulty cell. With the provision of n superfluous rows and $\eta$ superfluous columns, for example, n defective cells may be replaced in each column of the array with any number of the defective cells being in any number of different rows and an additional $\eta$ defective cells may be replaced in each row of the array with any number of the additional defective cells being in any number of different columns.

Figure 8:
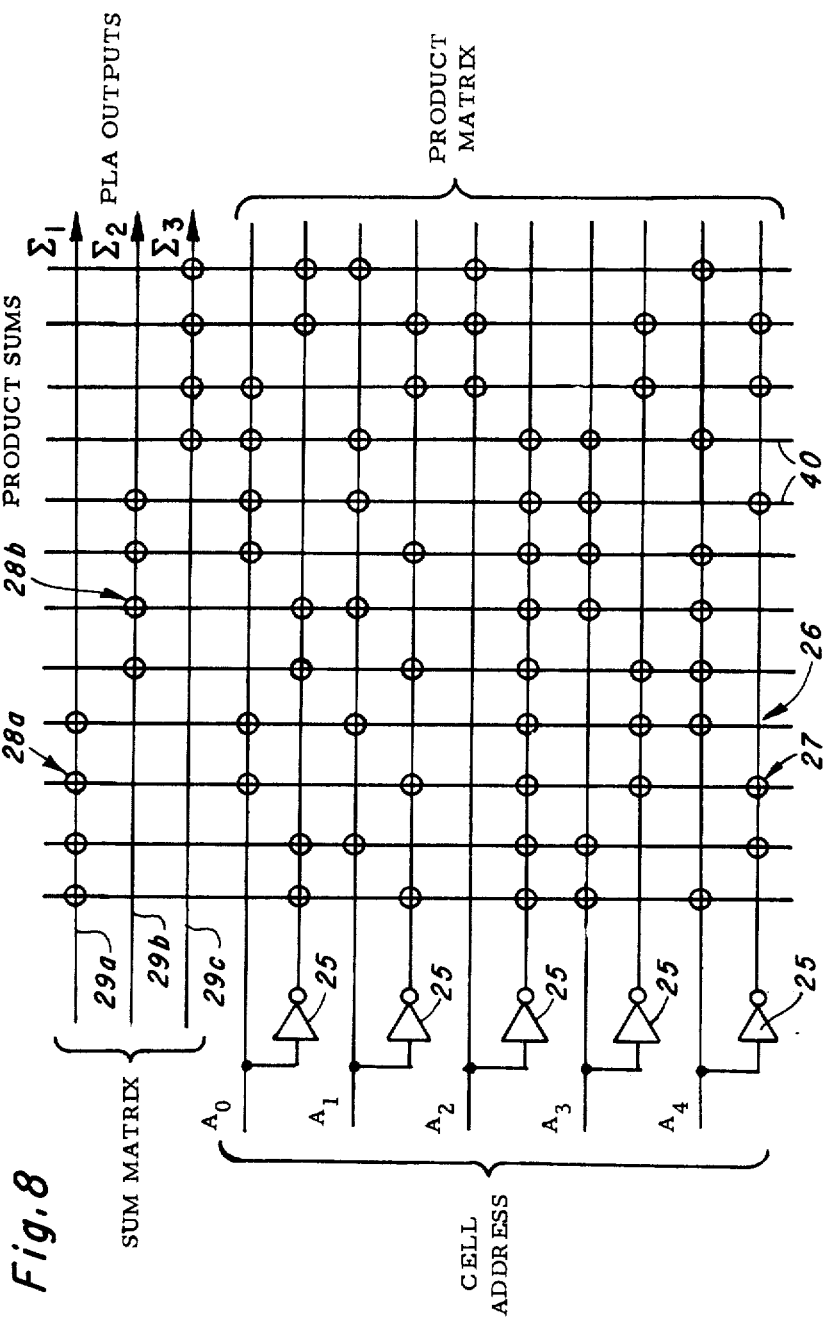
FIG. 8 is a logic diagram of an exemplary address storage means operable in conjunction with the embodiment of FIG. 7.

Whenever one of the defective cells 14 is addressed, the storage means 17c, an example of which is illustrated in FIG. 8 and described in Table III, recognizes such address and generates output signals $\Sigma_1 = 1, \Sigma_2 = 0, \Sigma_3 = 0$ which cause a corresponding cell in the superfluous row (or column) 32 to be selected, output signals $\Sigma_1 = 0, \Sigma_2 = 1, \Sigma_3 = 0$ which cause a corresponding cell in the superfluous column (or row) 31 to be selected, or output signals $\Sigma_1 = 0, \Sigma_2 = 0, \Sigma_3 = 1$ which cause a corresponding cell in the superfluous column (or row) 33 to be selected. By making term line connections to multiple sum lines in the sum matrix of the PLA the cells 35 and 36 may be utilized to substitute for cells in the redundant rows and columns 31-33 as well as any other defective cell in the array 10. Thus, with the term lines coupled to provide output signals $\Sigma_1 = 1, \Sigma_2 = 1, \Sigma_3 = 0$, the cell 35 is selected or with $\Sigma_1 = 1, \Sigma_2 = 0, \Sigma_3 = 1$, the cell 36 is selected instead of the addressed defective cell. With $\Sigma_1 = 1$ the output of NOT gate 18c $\overline{\Sigma_1} = 0$ so that normal selection of decoder 11 is inhibited by means of the AND gates 19 coupled thereto. With $\Sigma_2 = 1$ or $\Sigma_3 = 1$, the output of NOR gate 30c $\overline{\Sigma_2 + \Sigma_3} = 0$ so that the normal selection of decoder 12c is inhibited by means of the AND gates 19 coupled thereto. The PLA is programmed so that $\Sigma_2 = 1$ and $\Sigma_3 = 1$ do not occur simultaneously.

In the embodiment of FIG. 7, a 4 × 8 array is illustrated for purposes of example only. Correspondingly, the column or row decoder 12c is shown in FIG. 7 to have a 3-bit input ($A_2,A_3,A_4$) and to generate a one of eight output to select an appropriate column (or row) of the array 10. The input/output logic and overhead circuitry 15c is also shown in FIG. 7 as being expanded to provide access to the additional columns.

A PLA example of memory means 17c programmed to detect the pattern of defects (marked X) in the array of FIG. 7 is illustrated in FIG. 8. The structure and operation of the PLA is identical to that described above with respect to FIGS. 3 and 6. The addresses stored in the PLA of FIG. 8 are shown in Table III along with the corresponding PLA outputs $\Sigma_1 - \Sigma_3$.

TABLE III

| | ADDRESS | | | | OUTPUTS | | |
|---|---|---|---|---|---|---|---|
| $A_0$ | $A_1$ | $A_2$ | $A_3$ | $A_4$ | $\Sigma_1$ | $\Sigma_2$ | $\Sigma_3$ |
| 0 | 0 | 0 | 1 | 1 | 1 | 0 | 0 |
| 0 | 1 | 0 | 1 | 0 | 1 | 0 | 0 |
| 1 | 0 | 0 | 0 | 0 | 1 | 0 | 0 |
| 1 | 1 | 0 | 0 | 1 | 1 | 0 | 0 |
| 0 | 0 | 0 | 0 | 1 | 0 | 1 | 0 |
| 0 | 1 | 0 | 1 | 1 | 0 | 1 | 0 |
| 1 | 0 | 0 | 1 | 1 | 0 | 1 | 0 |
| 1 | 1 | 0 | 1 | 0 | 0 | 1 | 0 |
| 1 | 1 | 0 | 1 | 1 | 0 | 0 | 1 |
| 1 | 0 | 1 | 0 | 0 | 0 | 0 | 1 |

TABLE III-continued

| | ADDRESS | | | | OUTPUTS | | |
|---|---|---|---|---|---|---|---|
| $A_0$ | $A_1$ | $A_2$ | $A_3$ | $A_4$ | $\Sigma_1$ | $\Sigma_2$ | $\Sigma_3$ |
| 0 | 0 | 1 | 0 | 0 | 0 | 0 | 1 |
| 0 | 1 | 1 | 0 | 1 | 0 | 0 | 1 |
| — | E | L | S | E | 0 | 0 | 0 |

Other embodiments of the invention are expanded to provide fault tolerance for multiple arrays. Consider, for example, the embodiment of FIG. 4 in which a plurality of redundant columns (or rows) 31 and 33 are provided. In a variation of this embodiment, a plurality of arrays are provided with the column 31 associated with a first of the arrays and the column 33 associated with a second of the arrays. In such embodiment, the PLA stores the chip selection bit(s) of the address as well as the row and column bits so that whenever a defective cell is addressed in the first array the address of such cell is detected by the PLA and a $\Sigma_1 = 1$ signal generated and a cell in column 31 substituted for the defective cell; whenever a defective cell is addressed in the second array, such address is detected by the PLA and a $\Sigma_2 = 1$ signal generated and a cell in column 33 substituted for the defective cell.

Figure 9:
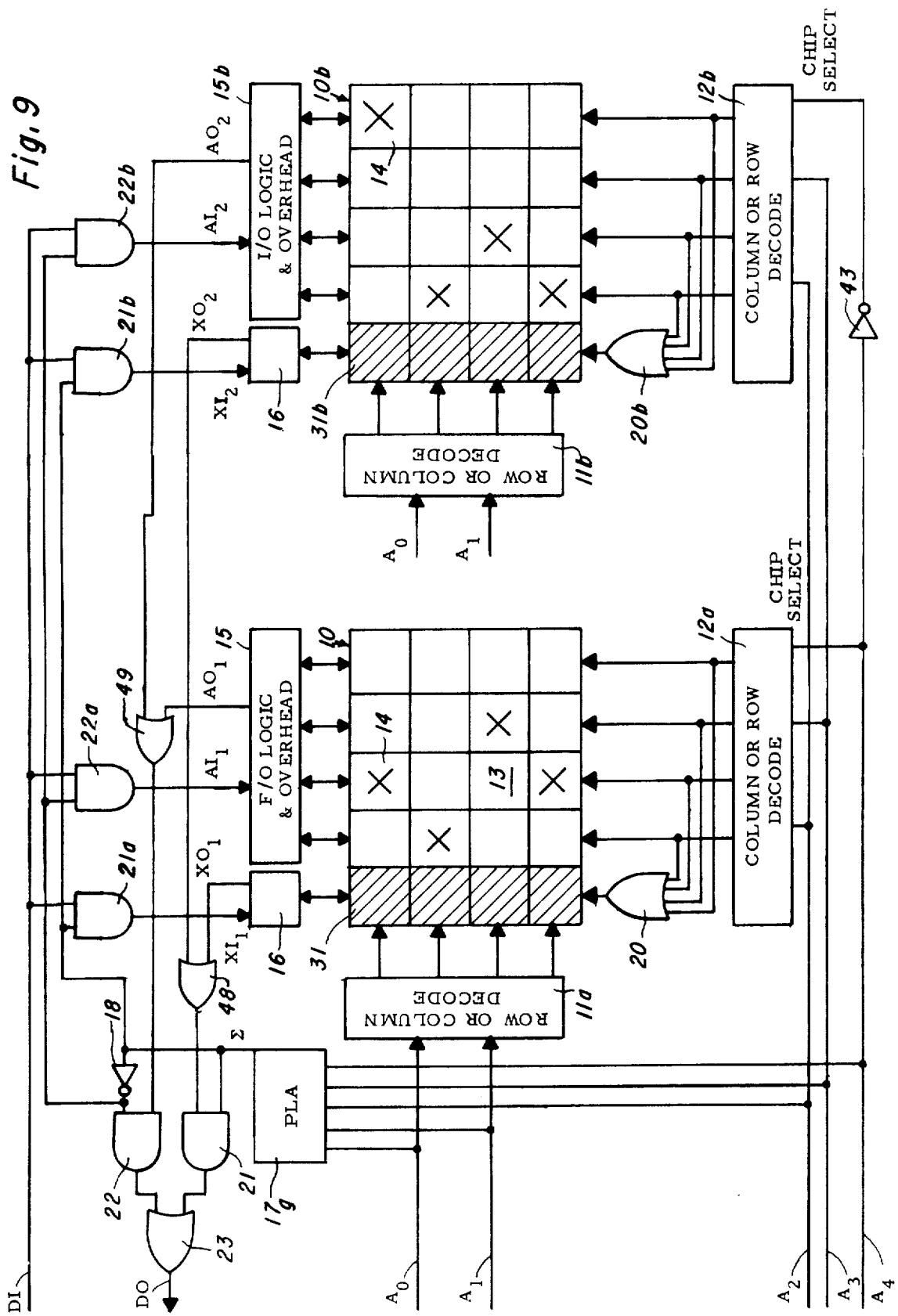
FIGS. 9 and 10 are yet further embodiments of the invention incorporating multiple arrays.

Yet another embodiment providing fault tolerance for multiple arrays is illustrated in FIG. 9. In FIG. 9, arrays 10 and 10b are each provided with row (or column) decoders 11 and 11b, respectively; column (or row) decoders 12a and 12b, respectively; and input/output logic and overhead circuitry 15 and 15b, respectively. Each array also includes a redundant column 31 and 31b, respectively. In the example of FIG. 9, a 5-bit address is generated with the bits $A_0$ and $A_1$ providing row (or column) selection, bits $A_2$ and $A_3$ providing column (or row) selection and bit $A_4$ providing array or chip selection of either array 10 or array 10b. In the simple example of FIG. 9, the array 10 is selected whenever bit $A_4 = 1$ and the array 10b is selected by means of NOT gate 43 whenever bit $A_4 = 0$. Other embodiments may include, for example, $2^n$ arrays with n bits of the address utilized for array or chip selection and incorporating an n bit to one of $2^n$ decoders similar to the decoders used for row or column selection.

In this embodiment, as in the embodiment of FIG. 2, both the defective cell and the replacement cell of one of the arrays are simultaneously addressed and whenever a defective cell is detected, the faulty cell address storage means 17g generates a signal to direct the data into or out of the reserve cell rather than the faulty cell. Only a single PLA and input/output steering logic is required for all of the arrays since the arrays are separately enabled by the chip select input.

Thus, whenever any one of the columns (or rows) of array 10 is selected by means of decoder 12a, the reserve column (or row) 31 is simultaneously addressed by means of OR gate 20 and whenever any one of the columns (or rows) of array 10b is selected by means of decoder 12b, the reserve column (or row) 31b is simultaneously addressed by means of OR gate 20b. Separate input/output logic and overhead circuitry 16 is provided for each of the reserve columns (or rows) 31 and 31b so that the outputs $XO_1$ and $XO_2$ and inputs $XI_1$ and $XI_2$ may be selected or steered separately from the array outputs $AO_1$ and $AO_2$ and array inputs $AI_1$ and $AI_2$ depending upon the output signal $\Sigma$ generated by faulty cell address storage means 17g. Thus, whenever one of the defective cells 14 is addressed in an output operation from either array, storage means 17g which receives the chip select address bits as well as the column and row address bits recognizes such address and generates an output signal $\Sigma = 1$ which allows AND gate 21 to transmit the redundant column or row output data $XO_1$ or $XO_2$ (depending upon which array is being enabled by the chip select bits) from OR gate 48 to the data output line DO by means of OR gate 23. With $\Sigma = 1$ the output of NOT gate 18 $\overline{\Sigma} = 0$ so that the normal data output selection from the array output lines $AO_1$ and $AO_2$ or OR gate 49 is inhibited by means of AND gate 22. In the addressing of normal cells for a data output operation from either array, the output of storage means 17g $\Sigma = 0$ and the output of NOT gate 18 $\overline{\Sigma} = 1$ which inhibits selection of the data output $XO_1$ and $XO_2$ from the redundant columns (or rows) 31 and 31b by means of AND gate 21 and allows normal data output transfer from output $AO_1$ or $AO_2$ from OR gate 49 by way means of AND gate 22 through OR gate 23. Data is input to the arrays 10 and 10b on the data input line DI and is directed to the $AI_1$ and $AI_2$ inputs by means of AND gate 22a in the addressing of normal cells and stored in the addressed cell of the selected array with $\Sigma = 0$; or directed to the $XI_1$ and $XI_2$ redundant column inputs by means of AND gates 21a and b whenever the address of a faulty cell is recognized by the storage means 17g which generates an output signal $\Sigma = 1$. The data will only be input to the array selected by the chip select input. As in the embodiment of FIG. 2, where the arrays 10 are comprised of ROM cells, the input data steering logic comprised of gates 21a, b and 22a, b is unnecessary.

Figure 11:
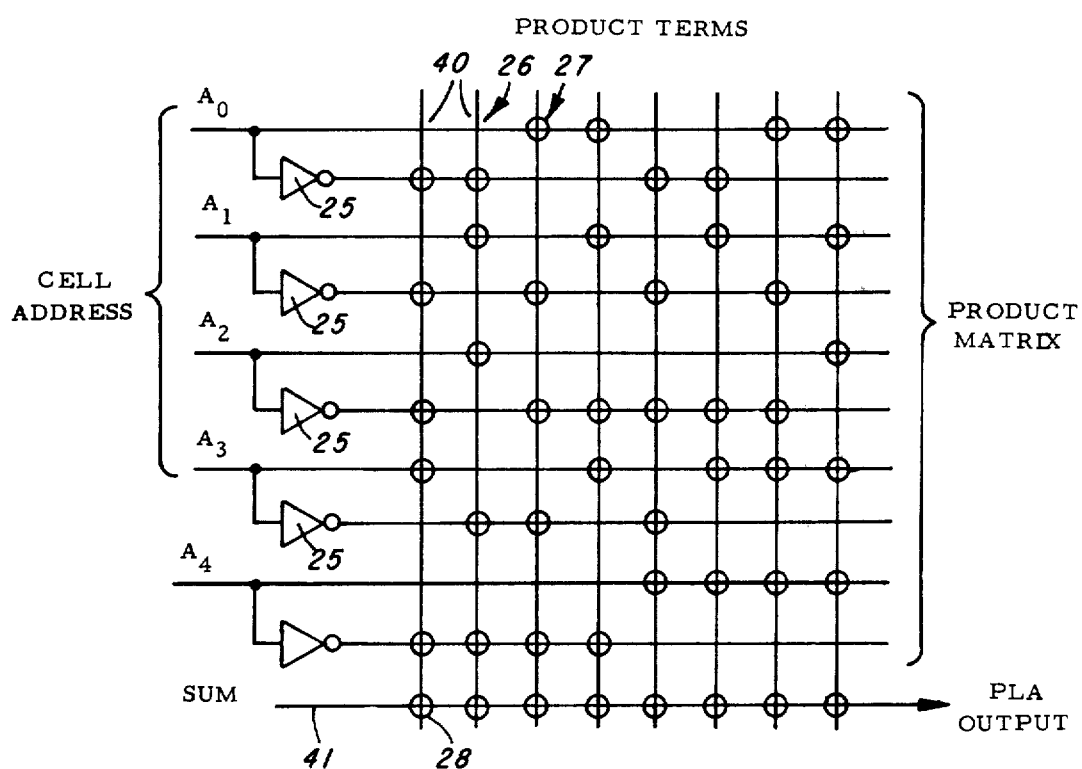
FIG. 11 is a logic diagram of an exemplary address storage means operable in conjunction with the embodiment of FIG. 9.

A PLA example of memory means 17g programmed to detect the pattern of defects (marked X) in the array of FIG. 9 is illustrated in FIG. 11. The structure and operation of the PLA is essentially identical to that described above with respect to FIGS. 3, 6 and 8. The addresses stored in the PLA of FIG. 11 are shown in Table IV below, along with the corresponding PLA output signal $\Sigma$.

Figure 10:
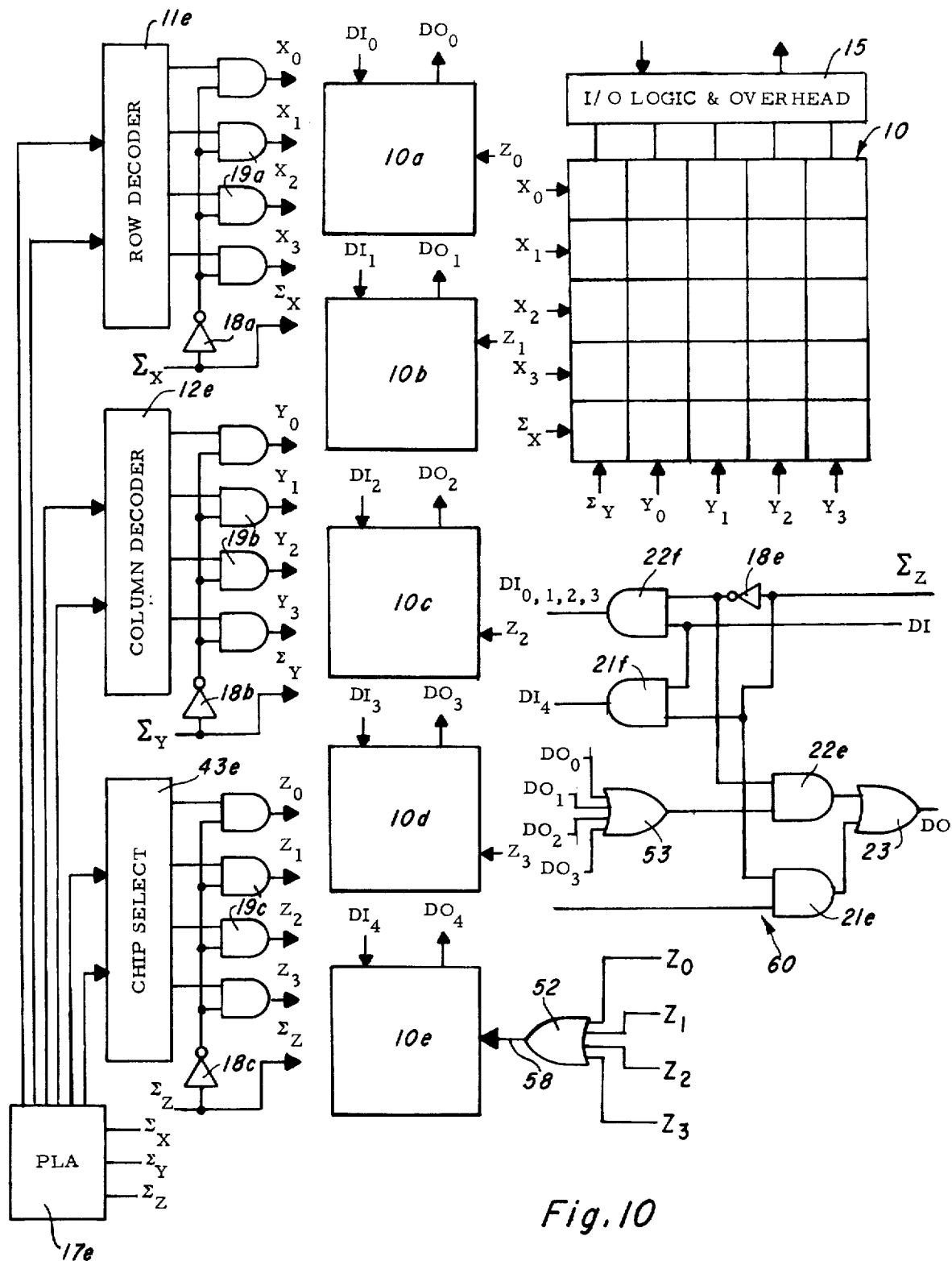

Still another embodiment of the invention providing fault tolerance for multiple arrays is illustrated in FIG. 10. The multiple array embodiment of FIG. 10 includes (by way of example only) five similar arrays 10a–e each provided with its own input/output and overhead circuitry 15 as shown for one such array 10 in the upper righ-hand corner of the figure. A single row decoder 11e and a single column decoder 12e is provided and coupled to all of the arrays to provide cell addressing of the cells within each array. A chip select decoder 43e is also provided which addresses a selected one of the arrays 10a–d. The array 10e is a redundant array. Each of the arrays 10a–e includes at least one redundant row or column and is shown here by way of example to be of the type having a redundant row and column according to the embodiment of FIG. 5.

TABLE IV

| $A_0$ | $A_1$ | $A_2$ | $A_3$ | $A_4$ | $\Sigma$ |
|---|---|---|---|---|---|
| 0 | 0 | 0 | 1 | 0 | 1 |
| 0 | 1 | 1 | 0 | 0 | 1 |
| 1 | 0 | 0 | 0 | 0 | 1 |
| 1 | 1 | 0 | 1 | 0 | 1 |
| 0 | 0 | 0 | 0 | 1 | 1 |
| 0 | 1 | 0 | 1 | 1 | 1 |
| 1 | 0 | 0 | 1 | 1 | 1 |
| 1 | 1 | 1 | 1 | 1 | 1 |

In the example of FIG. 10 a 6-bit address is generated with bits $A_0$ and $A_1$ providing row (or column) selection, bits $A_2$ and $A_3$ providing column (or row) selection and bits $A_4$ and $A_5$ providing chip selection of one of the arrays 10a–d.

There are two alternate implementations of the embodiment of FIG. 10. In the first implementation, an OR gate 52 is provided to receive chip select signals $Z_0$–$Z_3$ from chip select decoder 43e and thereby address array 10e each time any of arrays 10a–d are addressed. In this implementation, steering logic circuitry 60 is provided which selects whether the input data DI is to go to the addressed one of arrays 10a–d or the redundant array 10e by means of AND gates 22f and 21f, respectively; and whether output data is to be taken from one of the addressed arrays 10a–d through OR gate 53 or redundant array 10e by means of AND gates 22e and 21e, respectively, coupled to the data output DO by means of OR gate 23.

The alternate implementation of this embodiment eliminates the OR gate 52 and steering logic 60. This is accomplished by connecting the $\Sigma_Z$ output of PLA 17e directly to the chip select input 58 of redundant array 10e. In this implementation, whenever a cell in the redundant array 10e is to be addressed instead of a defective cell or a redundant cell in any of the arrays 10a–d, the $\Sigma_Z$ output of PLA is positively connnected to the product term line in the sum matrix so that whenever that defective cell is addressed the PLA output signal $\Sigma_Z = 1$. AND gates 19 selectively coupling the chip select decoder 43e to the chip select inputs of arrays 10a–d inhibit selection of the arrays 10a–d and the $\Sigma_Z = 1$ signal enables selection of the array 10e. In this alternate implementation, the data input lines $DI_0$–$DI_4$ of arrays 10a–e are commoned to a single input bus DI and the data output lines $DO_0$–$DO_4$ from arrays 10a–e are commoned to a single output line DO by an OR gate or the like.

An example of a PLA which is suitable for use in conjunction with the embodiment of FIG. 10 is shown in FIG. 12. As no specific defective cell pattern is shown in FIG. 10, the crossings in the product matrix have not been circled to indicate storage of specific defective cell addresses. The PLA of FIG. 12 is shown to include an additional address (and address complement) line to accommodate the additional chip select address bit $A_5$ and is otherwise operationally and structurally similar to the PLA described with respect to FIG. 8.

CONCLUSION

Various embodiments of fault-tolerant cell addressable arrays according to the present invention have now been described in detail. The described cell addressable arrays include superfluous cells in combination with a faulty cell address storage means and means responsive thereto for causing a reserve cell or the contents thereof to be selected instead of the faulty cell. In one embodiment described in detail above, a superfluous row or column of cells is provided in combination with a faulty cell address storage means which stores both the row and column address of each defective cell and causes a corresponding cell in the superfluous row or column to be selected instead of a faulty cell whenever the faulty cell is addressed. Another embodiment of the invention described in detail above also includes a superfluous row or column of cells in combination with a faulty cell address storage means which stores both the row and column addresses of each defective cell; the faulty cell address storage means in such embodiment steers the input and output data to a cell in the superfluous row or column whenever one of the defective cells is addressed. A further described embodiment of the invention provides a cell addressable array arranged in rows and columns with a plurality of redundant rows or columns of cells in combination with a faulty cell address storage means which stores both the row and column address of defective cells and whenever one of the defective cells is addressed generates signals which cause a corresponding cell in a selected one of the superfluous rows or columns to be selected instead of the faulty cell. This embodiment has also been shown to be applicable to multiple arrays and to variations in which steering logic is provided which directs data into and out of a cell in a selected one of the superfluous rows or columns according to signals generated by the storage means. In still other embodiments of the invention, described above in detail, cell addressable arrays are provided with at least one redundant row of cells and at least one redundant column of cells along with a faulty cell address storage means which stores both the row and column address of each defective cell and causes a corresponding cell in a selected one of the superfluous rows or columns to be selected instead of the faulty cell whenever one of the defective cells is addressed. In further of the embodiments described in detail above, multiple arrays are provided with fault-tolerance by including an address storage means which stores the array or chip address along with the column and row address of each defective cell so that whenever one of the defective cells is addressed, the storage means generates a signal which causes a corresponding superfluous cell of one array or the contents thereof to be selected instead of a faulty cell of such one array or of another array to provide two and three dimensional substitution arrangements.

As discussed above, fault-tolerant memory array systems are provided in accordance with the present invention. The memory arrays may, for example, comprise random access or read-only memory cells implemented, for example, as bipolar or MOS monolithic semiconductor structures with the faulty cell storage means being integrated in or separated from the monolithic semiconductor structure which comprises the memory. Both bipolar and MOS semiconductor memories suitable for adaptation to the fault-tolerant techniques of the present invention are well known in the art as described, for example, in the U.S. Pat. Nos. 3,436,738; 3,740,731; and 3,765,003 referenced above. It is also comtemplated that defective cells of more complex structures such as array processors may be substituted for according to the techniques of the present invention and the invention is not intended to be limited to memory arrays.

In the multiple array embodiments of the invention, it is contemplated that the arrays may each be separate structures such as monolithic integrated circuits or that all the arrays may be integrated on a single monolithic structure with or without the row, column and array (chip) decoder (or selector) and defective cell storage means.

The defective cell address storage means of the exemplified embodiments has been described as preferably being of the content addressable type because of the relatively small amount of surface area required for them although addressable storage means incorporating decoders and the like may also be utilized. For such addressable storage means the cell address is applied to the decoders of the addressable storage means and one or more cells containing the required control signals ($\Sigma$, etc.) addressed accordingly.

Electrically and mechanically programmable content addressable storage means have been described in detail and for monolithic semiconductor integrated circuit embodiments of the invention structurally compatible electrically programmable memory device techniques employing, for example, fusible links and avalanche induced migration bipolar and MOS memory elements have been described.

Accordingly, it has been shown that improved fault-tolerant cell addressable arrays are provided in accordance with the present invention. It has further been shown that embodiments of the present invention provide an addressable array of cells in which a plurality of cells located on different rows and columns of the array may be individually substituted for by the cells in a redundant row or column and that defective cells can be replaced by superfluous cells on an individual basis.

It has also been shown that, in accordance with the present invention, fully operable monolithic semiconductor arrays are provided even though such arrays contain bad cell locations. This is accomplished without the necessity of generating special metallization or wiring patterns and thereby substantially increases the yield of the production process for semiconductor arrays such as memory arrays.

It has also been shown that defective cell locations in systems embodying the present invention can be substituted for electrically and/or mechanically, either temporarily or semi-permanently, either at the time of testing or subsequently in the field by the provision of, for example, field programmable logic arrays which retain stored defective cell information even when all power to the system is shut off.

Embodiments of the invention have been shown to be particularly applicable to monolithic semiconductor memory arrays and provide improved memory systems which are capable of reliable operation even though defective locations are contained in the semiconductor arrays or modules which comprise the memory without having to change the external configuration of the semiconductor arrays. Such memory equipment is economically more favorable than present semiconductor memories because improved yield considerably reduce the cost per memory module.

Embodiments of the invention employing electrically field programmable defective cell address storage means are programmable after packaging by the application of electrical signals of predetermined power levels to selected pins external to the package thereby providing remote electrical substitution capability of spare memory locations for memory locations that are or become defective in the field. Accordingly, memory equipment is provided which can operate with undiminished capacity even when memory defects occur in use. It is contemplated that the defective memory cells may be detected automatically by a computer, for example, and the computer automatically generate the required power levels to the programmable logic array to effect the electrical substitution.

Accordingly, the several embodiments of the invention which have been described in detail are merely illustrative of the principle underlying the inventive concept. It is contemplated that various modifications of the described embodiments, as well as other embodiments of the invention, will without departing from the spirit and scope of the invention, be apparent to persons skilled in the art.

What is claimed is:

1. A defect-tolerant cell addressable array comprising:
   a. an array of functional cells arranged in rows and columns;
   b. a plurality of redundant functional cells;
   c. cell selection means responsive to cell address code signals for selectively addressing an individual functional cell in a respective row and column and simultaneously addressing a corresponding redundant cell;
   d. memory means in which address codes of the row and column addresses of defective functional cells are selectively storable, said memory means being responsive to said cell address code signals for detecting when the cell address code signals correspond to the address codes of defective ones of said functional cells and for generating a signal indicative thereof; and
   e. logic means responsive to the signal generated by said memory means for directing data into and/or out of the respectively addressed redundant cell instead of an addressed defective cell.

2. The defect-tolerant cell addressable array according to claim 1 wherein a redundant row and/or column of functional cells is provided.

3. The defect-tolerant cell addressable array according to claim 1 wherein said cell selection means selectively enables the addressed cells.

4. The defect-tolerant cell addressable array according to claim 1 wherein said cell selection means includes a row address decoder and a column address decoder.

5. The defect-tolerant cell addressable array according to claim 1 wherein said array, cell selection means, redundant functional cells, memory means and logic means are integrated as a monolithic semiconductor structure.

6. The defect-tolerant cell addressable array according to claim 5 wherein said memory means is programmable after said integrated monolithic semiconductor structure is fabricated.

7. The defect-tolerant cell addressable array according to claim 6 wherein said memory means is a field programmable logic array or read-only memory array.

8. The defect-tolerant cell addressable array according to claim 7 wherein said programmable logic array or read-only memory array is comprised of memory elements connected by fusible links.

9. The defect-tolerant cell addressable array according to claim 7 wherein said field programmable logic array or read-only memory array is comprised of semiconductor avalanche induced migration devices.

10. The defect-tolerant cell addressable array according to claim 1 wherein said memory means is a field programmable memory means.

11. The defect-tolerant cell addressable array according to claim 10 wherein said memory means is electrically programmable.

12. The defect-tolerant cell addressable array according to claim 11 wherein said memory means is a field programmable logic array or read-only memory array.

13. The defect-tolerant cell addressable array according to claim 12 wherein said programmable logic array or read-only memory array is comprised of memory elements connected by fusible links.

14. The defect-tolerant cell addressable array according to claim 12 wherein said field programmable logic array or read-only memory array is comprised of semiconductor avalanche induced migration devices.

15. The defect-tolerant cell addressable array according to claim 12 wherein said field programmable memory means is comprised of MNOS or FAMOS devices.

16. The defect-tolerant cell addressable array according to claim 10 wherein said memory means is mechanically programmable.

17. The defect-tolerant cell addressable array according to claim 16 wherein said memory means is programmable by the mechanical open-circuiting of selected bonded wires.

18. The defect-tolerant cell addressable array according to claim 16 wherein said memory means is programmed by the bonding of wires to selected terminals of said memory means.

19. The defect-tolerant cell addressable array according to claim 1 wherein said memory means is a content addressable memory.

20. The defect-tolerant cell addressable array according to claim 1 wherein said array is a random access memory array.

21. A defect-tolerant cell addressable array comprising:
   a. an array of functional cells arranged in rows and columns;
   b. at least one redundant row or column of functional cells;
   c. cell selection means responsive to row and column address code signals for selectively addressing an individual cell in a respective row and column and for simultaneously addressing a corresponding cell in said at least one redundant row or column;
   d. programmable or programmed memory means coupled to receive said row and column address code signals for detecting the address codes of defective ones of said functional cells and generating a signal indicative thereof, said memory means including means for storing the row and column address codes of one or more defective cells of said array of functional cells; and
   e. logic means coupled to said memory means and responsive to the generated signal for selectively transferring data into and/or out of the addressed cell in said redundant row or column each time a defective cell is detected by said memory means and for otherwise selectively transferring data into and/or out of the addressed cell of said array.

22. The defect-tolerant cell addressable array according to claim 21 wherein said logic means includes means for inhibiting the transfer of data into or out of the addressed cell of said array each time a defective cell is detected by said memory means and for otherwise inhibiting data transfer into and/or out of the addressed cell in said redundant row or column.

23. The defect-tolerant cell addressable array according to claim 21 wherein a redundant row of cells is provided and wherein data is input to or output from the functional cell in such redundant row in the same column as the addressed defective cell which is selected by said cell selection means.

24. The defect-tolerant cell addressable array according to claim 21 wherein a redundant column of cells is provided and wherein data is input to or output from the functional cell in such redundant column in the same row as the addressed defective cell which is selected by said cell selection means.

25. The defect-tolerant cell addressable array according to claim 21 wherein a plurality of redundant rows or columns of cells are provided and wherein said memory means generates a signal for selecting one of said redundant rows or columns to or from which data is to be transferred instead of a defective cell.

26. The defect-tolerant cell addressable array according to claim 25 wherein a plurality of redundant rows of cells is provided and wherein data is input to or output from the functional cell in a selected redundant row in the same column as the addressed defective cell which is selected by said cell selection means.

27. The defect-tolerant cell addressable array according to claim 25 wherein a plurality of redundant columns of cells is provided and wherein data is input to or output from the functional cell in a selected redundant column in the same row as the addressed defective cell which is selected by said cell selection means.

28. The defect-tolerant cell addressable array according to claim 21 wherein said cell selection means selectively enables the addressed cells.

29. The defect-tolerant cell addressable array according to claim 21 wherein said cell selection means includes a row address decoder and a column address decoder.

30. The defect-tolerant cell addressable array according to claim 21 wherein said array, cell selection means, redundant functional cells, memory means and logic means are integrated as a monolithic semiconductor structure.

31. The defect-tolerant cell addressable array according to claim 30 wherein said memory means is programmable after said integrated monolithic semiconductor structure is fabricated.

32. The defect-tolerant cell addressable array according to claim 31 wherein said memory means is a field programmable logic array or read-only memory array.

33. The defect-tolerant cell addressable array according to claim 32 wherein said programmable logic array or read-only memory array is comprised of memory elements connected by fusible links.

34. The defect-tolerant cell addressable array according to claim 32 wherein said field programmable logic array or read-only memory array is comprised of semiconductor avalanche induced migration devices.

35. The defect-tolerant cell addressable array according to claim 21 wherein said memory means is a field programmable memory means.

36. The defect-tolerant cell addressable array according to claim 35 wherein said memory means is electrically programmable.

37. The defect-tolerant cell addressable array according to claim 36 wherein said memory means is a field programmable logic array or read-only memory array.

38. The defect-tolerant cell addressable array according to claim 37 wherein said programmable logic array or read-only memory array is comprised of memory elements connected by fusible links.

39. The defect-tolerant cell addressable array according to claim 37 wherein said field programmable logic array or read-only memory array is comprised of semiconductor avalanche induced migration devices.

40. The defect-tolerant cell addressable array according to claim 37 wherein said field programmable memory means is comprised of MNOS or FAMOS devices.

41. The defect-tolerant cell addressable array according to claim 35 wherein said memory means is mechanically programmable.

42. The defect-tolerant cell addressable array according to claim 41 wherein said memory means is programmable by the mechanical open-circuiting of selected bonded wires.

43. The defect-tolerant cell addressable array according to claim 41 wherein said memory means is programmed by the bonding of wires to selected terminals of said memory means.

44. The defect-tolerant cell addressable array according to claim 21 wherein said memory means is a content addressable memory.

45. The defect-tolerant cell addressable array according to claim 21 wherein said array is a random access memory array.

46. A system of defect-tolerant cell addressable arrays comprising:
  a. a plurality of arrays of functional cells each being arranged in rows and columns;
  b. at least one redundant row or column of functional cells associated with each of said arrays;
  c. cell selection means responsive to row, column and array address code signals for selectively addressing an individual cell in a respective row, column and array and for simultaneously addressing a corresponding cell in the redundant row or column of such array;
  d. programmable or programmed memory means coupled to receive said row, column and array address code signals for detecting the address codes of defective ones of said functional cells and for generating a signal indicative thereof, said memory means including means for storing the row, column and array address codes of one or more defective cells of said arrays of functional cells; and
  e. logic means coupled to said memory means and responsive to the generated signal for selectively directing data into and/or out of the addressed cell of said arrays or said redundant row or column in dependence upon the signal generated by said memory means.

47. The system according to claim 46 wherein each of said arrays are integrated circuit modules.

48. The system according to claim 46 wherein said plurality of arrays are integrated as a monolithic semiconductor structure.

49. The system according to claim 48 wherein said cell selection means, memory means and logic means are integrated on the same structure.

50. A system of defect-tolerant cell addressable arrays comprising:
  a. a plurality of arrays, including at least one redundant array, of functional cells each being arranged in rows and columns;
  b. at least one redundant row or column of functional cells associated with each of said arrays;
  c. cell selection means responsive to row, column and array address code signals for selectively addressing an individual cell in a respective row, column and array;
  d. programmable or programmed memory means coupled to receive said row, column and array address code signals for detecting the address codes of defective ones of said functional cells and for generating a signal indicative thereof, said memory means including means for storing the row, column and array address codes of one or more defective cells of said arrays of functional cells; and e. logic means coupled to said memory means and responsive to said generated signal for directing data into and/or out of a functional cell in said redundant array instead of the defective cell in the addressed array.

51. The system according to claim 50 wherein each of said arrays are integrated circuit modules.

52. The system according to claim 59 wherein said plurality of arrays are integrated as a monolithic semiconductor structure.

53. The system according to claim 52 wherein said cell selection means, memory means and logic means are integrated on the same structure.

* * * * *